United States Patent
Salgunan

(10) Patent No.: US 7,559,043 B2
(45) Date of Patent: Jul. 7, 2009

(54) LIBRARY TEST CIRCUIT AND LIBRARY TEST METHOD

(75) Inventor: Nithin Salgunan, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 273 days.

(21) Appl. No.: 11/638,367

(22) Filed: Dec. 14, 2006

(65) Prior Publication Data

US 2007/0157141 A1    Jul. 5, 2007

(30) Foreign Application Priority Data

Dec. 29, 2005   (KR)   ................. 10-2005-0133969

(51) Int. Cl.
*G06F 17/50*   (2006.01)
(52) U.S. Cl. ............................................. 716/4; 716/5
(58) Field of Classification Search .................. 716/4–6
See application file for complete search history.

(56) References Cited

U.S. PATENT DOCUMENTS

| | | | | |
|---|---|---|---|---|
| 6,449,751 B1 * | 9/2002 | Hussain et al. | ................. | 716/4 |
| 6,490,715 B1 * | 12/2002 | Moriwaki et al. | ............. | 716/17 |
| 7,120,571 B2 * | 10/2006 | Shei et al. | ..................... | 703/23 |

\* cited by examiner

*Primary Examiner*—Stacy A Whitmore
*Assistant Examiner*—Binh C Tat
(74) *Attorney, Agent, or Firm*—Finnegan, Henderson, Farabow, Garrett & Dunner, L.L.P.

(57) ABSTRACT

A library test circuit for verifying functions of a plurality of standard cell library logic cells includes a core module including a plurality of standard cell library logic cells, each logic cell having a predetermined number of input vector combinations, the core module outputting test result signals according to a standard cell library; a first switch bank for outputting a first input signal to the core module so as to select cell identifiers corresponding to respective logic cells; and a second switch bank for outputting a second input signal to the core module so as to select pattern identifiers corresponding to input vector combinations of each logic cell.

9 Claims, 1 Drawing Sheet

LIBRARY TEST CIRCUIT AND LIBRARY TEST METHOD

RELATED APPLICATION

This application is based upon and claims the benefit of priority to Korean Application No. 10-2005-0133969, filed on Dec. 29, 2005, the entire contents of which are incorporated herein by reference.

TECHNICAL FIELD

The present invention generally relates to a library test circuit and a library test method, and more particularly, to a library test circuit and a library test method, which may be used to verify the functions of a plurality of standard cell library logic cells.

BACKGROUND

In Application-Specific Integrated Circuit (ASIC) technology fields for manufacturing integrated circuits using submicron technologies, a logic circuit designer uses a large number of logic cells, which play a dominant role in the design of microchips. When logic cells are used, a circuit designer selects suitable logic cells to be used in a target circuit from a specific list of logic cells, namely a standard cell library. All logic cells listed in such a standard cell library must be operated in a specified manner, and a circuit designer assumes that all of the logic cells will precisely operate in the intended way.

Therefore, the providers of the standard cell library must verify the functions of each logic cell. Various attempts to verify such functions are continuously made.

However, a unified test method, which is universally applicable to various design rules and various standard cell libraries, is in great demand.

SUMMARY

Consistent with the present invention, there is provided a library test circuit and a library test method, which is universally applicable to various design rules and standard cell libraries having various numbers of logic cells, regardless of the degree of integration thereof.

In accordance with a preferred embodiment, there is provided a library test circuit for verifying functions of a plurality of standard cell library logic cells, the library test circuit comprising a core module including a plurality of standard cell library logic cells, each logic cell having a predetermined number of input vector combinations, the core module outputting test result signals according to a standard cell library; a first switch bank for outputting a first input signal to the core module so as to select cell identifiers corresponding to respective logic cells; and a second switch bank for outputting a second input signal to the core module so as to select pattern identifiers corresponding to input vector combinations of each logic cell.

In accordance with another preferred embodiment, there is provided a library test circuit for verifying functions of a plurality of standard cell library logic cells, the library test circuit comprising a core module including a plurality of standard cell library logic cells, each logic cell having a predetermined number of input vector combinations, wherein the core module outputs cell identifiers corresponding to respective logic cells, and pattern identifiers corresponding to respective input vector combinations of each logic cell; wherein, in an automatic mode, all of the cell identifiers are automatically sequentially selected, and all of the pattern identifiers corresponding to the selected cell identifiers are output to respective logic cells; and wherein the core module outputs test result signals according to a standard cell library for each cell identifier and for each pattern identifier.

In accordance with still another preferred embodiment, there is provided a library test method comprising performing a test in an automatic mode by outputting cell identifiers corresponding to respective standard cell library logic cells, and pattern identifiers corresponding to respective input vector combinations of each logic cell, to a core module including the logic cells; performing a test in a semi-automatic mode by manipulating a first switch bank so as to select cell identifiers corresponding to one or more logic cells, among the logic cells, and output the selected cell identifiers to the core module; performing a test in a manual mode by manipulating a second switch bank so as to select pattern identifiers corresponding to one or more input vector combinations, among the input vector combinations of each logic cell, and output the selected pattern identifiers to the core module; and receiving test result signals according to a standard cell library from the core module.

BRIEF DESCRIPTION OF THE DRAWINGS

The above and other features consistent with the present invention will become apparent from the following description of preferred embodiments given in conjunction with the accompanying drawings, in which.

DETAILED DESCRIPTION

Figure 1:
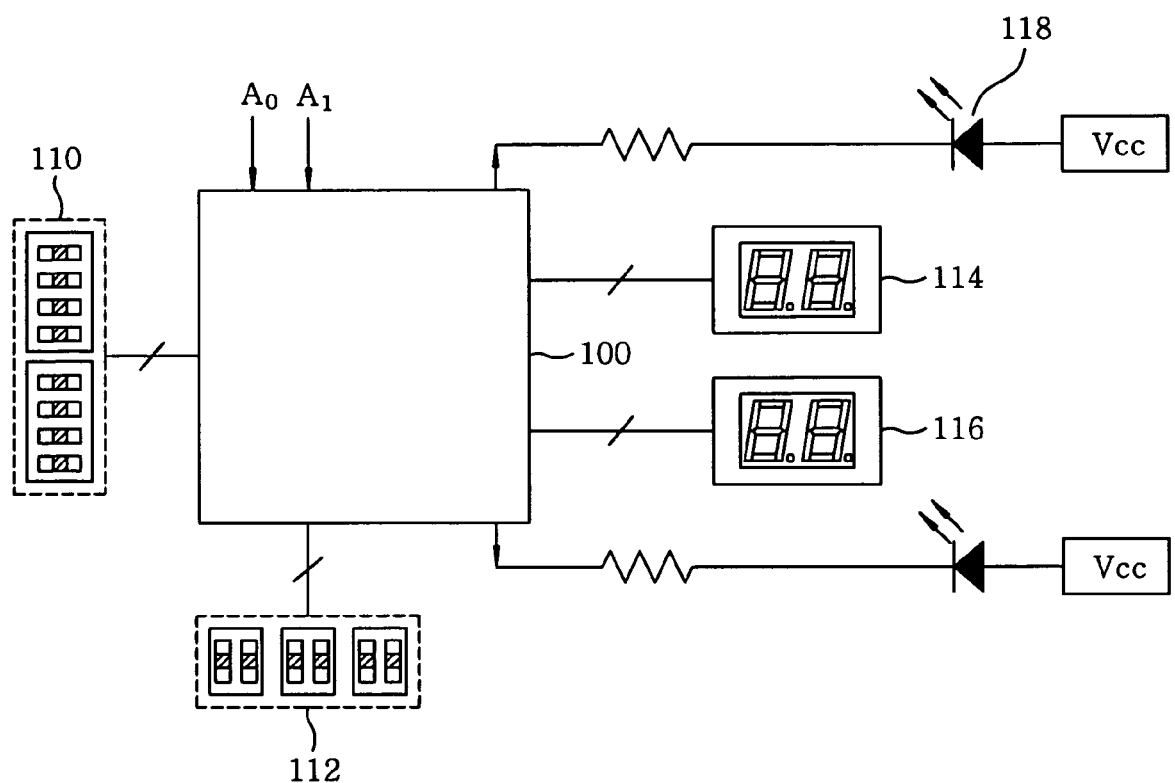
FIG. 1 is a circuit diagram showing a library test circuit consistent with the present invention.

Hereinafter, a library test circuit and a library test method consistent with preferred embodiments of the present invention will be described in detail with reference to the accompanying drawings so that they can be readily implemented by those skilled in the art.

Consistent with the present invention, there is provided a test circuit and a test method for verifying the functions of logic cells of a standard cell library. Once a module is prepared, the verification of logic cells may be easily performed by arranging the module on a Printed Circuit Board (PCB) in which the library test circuit has been implemented.

Consistent with the present invention, a unique number called a cell identifier (cell ID) is assigned to each of the logic cells of the standard cell library, and the number of input/output lines of each logic cell is recorded so that a logic cell having the maximum number of input lines and a logic cell having the maximum number of output lines are determined. Therefore, the number of input vector combinations is set to 2×In depending on the maximum number of input lines In. Since such an input vector combination is also intrinsic, it functions as a pattern identifier.

FIG. 1 is a circuit diagram showing a library test circuit consistent with the present invention.

As shown in FIG. 1, a specific cell identifier and a specific pattern identifier are selected using switch banks 110 and 112, respectively, so that a test is performed on logic cells having corresponding input vector combinations. Each of switch banks 110 and 112 has a plurality of switches, each outputting a signal of "1" or "0," thus selecting a cell identifier or a pattern identifier. For example, switch bank 110 may identify 128 logic cells of the library by generating a 7-bit cell identifier.

In the test circuit of FIG. 1, a core module 100 includes logic cells of a standard cell library, which are targets for function verification. Core module 100 outputs test result signals for respective logic cells to display devices 114 and 116, thereby displaying test results on cell identifier display device 114 and pattern identifier display device 116. For example, hexadecimal display devices, manufactured by TAOS Inc. of Texas, may be used for display devices 114 and 116.

A verification algorithm consistent with the present invention includes three operating modes, that is, an automatic mode, a semi-automatic mode, and a manual mode, thus providing more precise verification results, and shortening the time required for verification. For core module 100 of FIG. 1, the three operating modes may be selected using a combination of two switches (not shown), which respectively provide outputs A0 and A1. Among the three operating modes, the automatic mode is most widely used.

When the automatic mode is selected, pattern identifiers for all input vector combinations of respective logic cells, as well as cell identifiers for all logic cells, are input to core module 100. That is, in the automatic mode, since all cell identifiers and all pattern identifiers are sequentially automatically selected, switch banks 110 and 112 are not used at all.

The algorithm in the automatic mode is initiated by selecting a cell identifier corresponding to a specific logic cell. Once a specific cell identifier is selected, all possible pattern identifiers corresponding to the cell identifier are sequentially automatically selected, and are then input to core module 100. If all of the pattern identifiers for the selected cell identifier are input to core module 100, a subsequent cell identifier is automatically selected, and the same algorithm is repeated.

During this procedure, if an error is detected in a specific cell, a specific bit of a test result signal output from core module 100 is activated to indicate the error, and LED 118 is activated to display an error status signal. Accordingly, the identification code of the cell, in which the error is detected, is displayed on display devices 114 and 116.

The advantages of the automatic mode includes: 1) all input combinations of all cells may be verified at one time; 2) cells having functional errors may be individually indicated; and 3) the total number of cells having functional errors may be detected.

Meanwhile, if the test in the automatic mode is completed, verification in the semi-automatic mode is preferably performed to re-verify the specific cell in which the error is detected.

In the algorithm of the semi-automatic mode, a user selects a cell identifier corresponding to a specific logic cell through the manipulation of switch bank 110. Once a specific cell identifier is selected by the user, pattern identifiers corresponding to the cell identifier are sequentially automatically selected in order to select all input vector combinations of the specific logic cell corresponding to the cell identifier. The pattern identifiers are then input to and verified by core module 100. During this procedure, if an error is detected in a specific input combination, a specific bit of the test result signal output from core module 100 is activated to indicate an error, and LED 118 is activated to display an error status signal. Accordingly, the identification code of the input combination, in which the error is detected, is displayed on display device 116.

The advantages of the semi-automatic mode includes: 1) all input vector combinations of a selected logic cell may be verified; and 2) among the input combinations of a selected logic cell, an input combination in which an error is detected may be individually indicated.

Meanwhile, if the test in the semi-automatic mode is completed, verification in the manual mode is preferably performed to re-verify a specific input combination of the specific logic cell in which the error is detected.

In the operation of the manual mode, if the user selects a cell identifier corresponding to a specific logic cell and a pattern identifier corresponding to a specific input combination of the selected logic cell, respectively, through the manipulation of respective switch banks 110 and 112, and transmits the selected cell identifier and pattern identifier to core module 100, core module 100 then outputs a test result signal for the corresponding input combination of the logic cell to display devices 114 and 116.

Meanwhile, the core module may output a core status signal indicating in what operating status the library test circuit is working, i.e., automatic, semi-automatic, or manual mode. The library test circuit may further be equipped with LEDs to display such core status signal.

As described above, the library test circuit and the library test method consistent with the present invention include the following advantages.

First, the test circuit is universally applicable to various design rules, and standard cell libraries, including various numbers of logic cells, regardless of the degree of integration thereof.

Second, the verification algorithm includes three operating modes, that is, an automatic mode, a semi-automatic mode, and a manual mode, thus providing more precise verification results, and shortening the time required for verification.

While the invention has been shown and described with respect to the preferred embodiments, it will be understood by those skilled in the art that various changes and modifications may be made without departing from the spirit and scope of the invention as defined in the following claims. If the changes and modifications fall within the scope of the claims or equivalents thereof, they should be interpreted as falling within the scope of the present invention.

What is claimed is:

1. A library test circuit for verifying functions of a plurality of standard cell library logic cells, the library test circuit comprising:
   a core module including a plurality of standard cell library logic cells, each logic cell having a predetermined number of input vector combinations, the core module outputting test result signals according to a standard cell library;
   a first switch bank for outputting a first input signal to the core module so as to select cell identifiers corresponding to respective logic cells;
   a second switch bank for outputting a second input signal to the core module so as to select pattern identifiers corresponding to input vector combinations of each logic cell;
   a first display device; and
   a second display device;
   wherein, in an automatic mode where all cell identifiers and all pattern identifiers are sequentially automatically selected, the first display device and the second display device display an identification code of the logic cell in which an error is detected,
   wherein, in a semi-automatic mode where a cell identifier for the semi-automatic mode is selected and all pattern identifiers corresponding to the cell identifier for the semi-automatic mode are sequentially automatically selected, the second display device displays an identification code of the input vector combination in which an error is detected, wherein, in a manual mode where a cell identifier for the manual mode is selected and a pattern identifier for the manual mode is selected, the first display device and the second display device display a test result signal thereof, and wherein the test result outputted by the core module presents the error detected in the automatic mode, the semi-automatic mode or the manual mode.

2. The library test circuit of claim 1, wherein the first switch bank is manipulated in a semi-automatic mode, and the first switch bank or the second switch bank is manipulated in a manual mode.

3. The library test circuit of claim 1, wherein the automatic mode, the semi-automatic mode and the manual mode are sequentially performed in that order so that verification of the semi-automatic mode is performed on only a specific logic cell in which the error of the automatic mode is detected and verification of the manual mode is performed on only the input vector combination, in which the error of the semi-automatic mode is detected, of the specific logic cell.

4. A library test method for verifying functions of a plurality of standard cell library logic cells, each logic cell having a predetermined number of input vector combinations, the library test method comprising:

performing a test in an automatic mode by outputting cell identifiers corresponding to respective logic cells, and pattern identifiers corresponding to respective input vector combinations of each logic cell, to a core module including the logic cells;

performing a test in a semi-automatic mode by manipulating a first switch bank so as to select cell identifiers corresponding to one or more logic cells, among the logic cells, and output the selected cell identifiers to the core module;

performing a test in a manual mode by manipulating the first switch bank and a second switch bank so as to select pattern identifiers corresponding to one or more input vector combinations, among the input vector combinations of each logic cell, and output the selected pattern identifiers to the core module; and receiving test result signals according to a standard cell library from the core module;

wherein, in the automatic mode, a first display device and a second display device display an identification code of the logic cell in which an error is detected, wherein, in a semi-automatic mode, the second display device displays an identification code of the input vector combination in which an error is detected, and wherein, in a manual mode, the first display device and the second display device display a test result signal thereof.

5. The library test method of claim 4, wherein the test in the automatic mode is performed before the tests in the semi-automatic mode and in the manual mode are performed.

6. The library test method of claim 4, wherein the test in the semi-automatic mode is performed after the test in the automatic mode is terminated and before the test in the manual mode is performed.

7. The library test method of claim 4, wherein the test in the semi-automatic mode is performed on logic cells, for which a test result signal received from the core module indicates a failure.

8. The library test method of claim 4, wherein the test in the manual mode is performed both on logic cells and on input vector combinations, for which a test result signal received from the core module indicates a failure.

9. The library test method of claim 4, wherein the automatic mode, the semi-automatic mode and the manual mode are sequentially performed in that order so that verification of the semi-automatic mode is performed on only a specific logic cell in which the error of the automatic mode is detected and verification of the manual mode is performed on only the input vector combination, in which the error of the semi-automatic mode is detected, of the specific logic cell.

* * * * *